United States Patent
Harle et al.

(10) Patent No.: US 6,849,881 B1
(45) Date of Patent: Feb. 1, 2005

(54) OPTICAL SEMICONDUCTOR DEVICE COMPRISING A MULTIPLE QUANTUM WELL STRUCTURE

(75) Inventors: Volker Harle, Laaber (DE); Berthold Hahn, Hemau (DE); Hans-Jürgen Lugauer, Werzenbach (DE); Helmut Bolay, Pettendorf (DE); Stefan Bader, Regensburd (DE); Dominik Eisert, Regensburg (DE); Uwe Strauss, Bad Abbach (DE); Johannes Völkl, Erlangen (DE); Ulrich Zehnder, Regensburg (DE); Alfred Lell, Maxhütte-Haidhof (DE); Andreas Weimer, Regensburg (DE)

(73) Assignee: Osram GmbH (DE)

( * ) Notice: Subject to any disclaimer, the term of this patent is extended or adjusted under 35 U.S.C. 154(b) by 359 days.

(21) Appl. No.: 09/913,394

(22) PCT Filed: Nov. 20, 2000

(86) PCT No.: PCT/DE00/04089

§ 371 (c)(1),
(2), (4) Date: Feb. 5, 2002

(87) PCT Pub. No.: WO01/39282

PCT Pub. Date: May 31, 2001

(30) Foreign Application Priority Data

Nov. 19, 1999 (DE) .......................... 199 55 747

(51) Int. Cl.⁷ ................ H01L 31/0328; H01L 31/0336; H01L 31/072; H01L 31/109; H01L 32/26

(52) U.S. Cl. ...................... 257/191; 257/190; 257/184; 257/185; 257/189

(58) Field of Search ................................ 257/184, 185, 257/189, 190, 191, 200, 201

(56) References Cited

U.S. PATENT DOCUMENTS

5,684,309 A * 11/1997 McIntosh et al. ........... 257/191

(List continued on next page.)

FOREIGN PATENT DOCUMENTS

| DE | 19648955 | | 5/1997 |
|---|---|---|---|
| EP | 0666624 B1 | | 2/1995 |
| EP | 0731510 A2 | | 9/1996 |
| EP | 0833395 A2 | | 9/1997 |
| EP | 09080988 A2 | | 4/1999 |
| EP | 1017113 A1 | | 7/2000 |
| JP | 10-242512 | * | 9/1998 |
| JP | 10242512 | | 11/1998 |

OTHER PUBLICATIONS

S.D. Lester et al., High–efficiency InGaN MQW blue and green LEDs, Journal of Crystal Growth, 189/190 (1998), pp 786–789, Elsevier Science B.V..

(List continued on next page.)

Primary Examiner—Nathan J. Flynn
Assistant Examiner—Victor A. Mandala, Jr.
(74) Attorney, Agent, or Firm—Fish & Richardson P.C.

(57) ABSTRACT

An optical semiconductor device with a multiple quantum well structure, is set out in which well layers and barrier layers, comprising various types of semiconductor layers, are alternately layered. The device well layers comprise a first composition based on a nitride semiconductor material with a first electron energy. The barrier layers comprise a second composition of a nitride semiconductor material with electron energy which is higher in comparison to the first electron energy. The well and barrier layers are in the direction of growth, by a radiation-active quatum well layer which with the essentially non-radiating well layers (6a) and the barrier layers (6b), arranged in front, form a supperlattice.

25 Claims, 3 Drawing Sheets

U.S. PATENT DOCUMENTS

| | | | |
|---|---|---|---|
| 5,831,277 A | | 11/1998 | Razeghi |
| 5,851,905 A | * | 12/1998 | McIntosh et al. ............ 438/492 |
| 5,875,052 A | * | 2/1999 | Shmagin et al. ............. 359/244 |
| 6,023,077 A | | 2/2000 | Iyechika et al. |
| 6,198,112 B1 | * | 3/2001 | Ishida et al. ................... 257/15 |
| 6,377,597 B1 | * | 4/2002 | Okumura ...................... 372/45 |
| 6,449,299 B1 | * | 9/2002 | Sato ............................. 372/45 |
| 6,614,059 B1 | * | 9/2003 | Tsujimura .................... 257/101 |
| 2002/0085603 A1 | * | 7/2002 | Okumura ...................... 372/45 |

OTHER PUBLICATIONS

Sergey Yu. Karpov et al., "A Quantitative Model of Surface . . . ", Materials Research Society, vol. 618, 2000, pp. 185–191.

Jean–Michel Gérard, "Growth of InGaAs/GaAs heterostructures with abrupt interfaces on the monlayer scale", Journal of Crystal Growth, vol. 150, 1995, pp. 467–472.

* cited by examiner

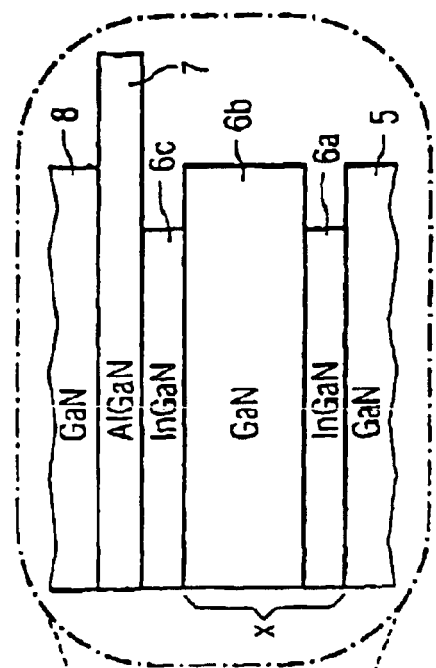
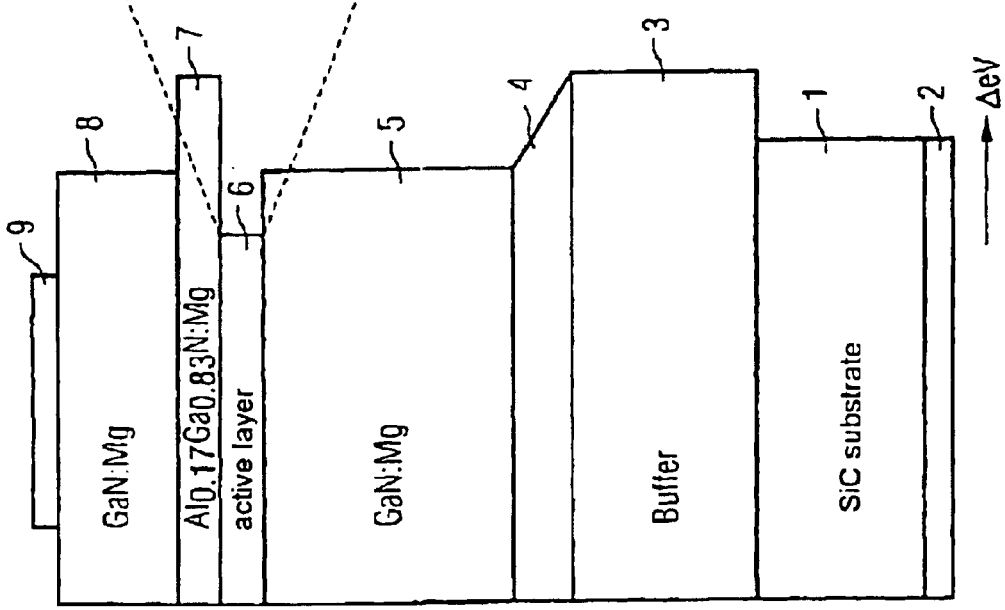

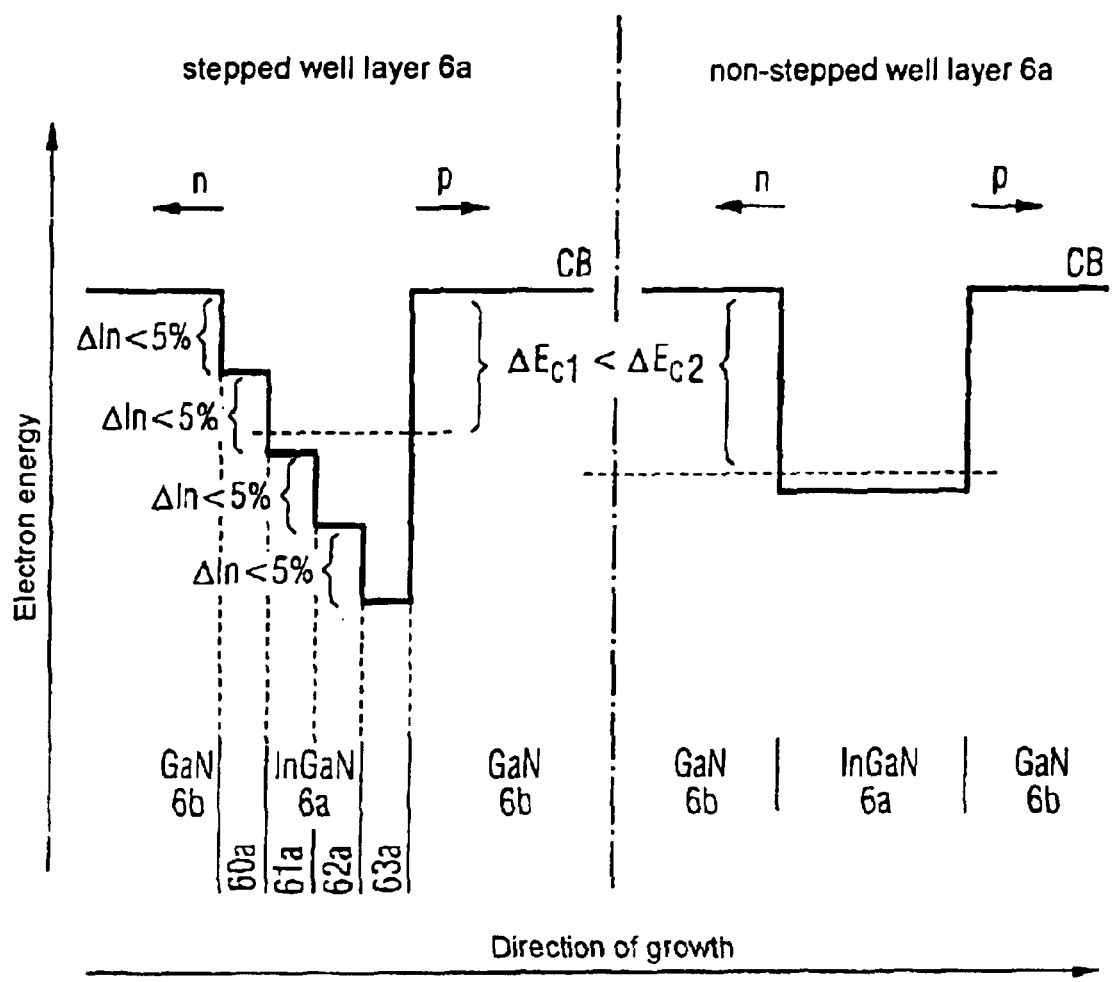

OPTICAL SEMICONDUCTOR DEVICE COMPRISING A MULTIPLE QUANTUM WELL STRUCTURE

CROSS REFERENCE TO RELATED APPLICATIONS

This application claims priority to International Application No.: PCT/DE00/04089 which was published May 31, 2001. This application further claims priority to German patent application 19955747.0 filed 19 Nov. 1999.

BACKGROUND OF THE INVENTION

The invention relates to an optical semiconductor device with a multiple quantum well structure, in which well layers and barrier layers comprising various types of semiconductor layers are alternately layered.

A device of this type is known for example from EP 0 666 624 B1 or from the Journal of Crystal Growth 189/190 (1998) pages 786–789.

The high quantum efficiency of indium-gallium-nitride (InGaN)-based LEDs and laser diodes is caused by the self-organized growth of indium-rich islands in the active quantum well. As a result, the injected charge carriers are spatially localized at these islands and are prevented from non-radiating recombination at lattice defects.

The nucleation of these quantum dots must be initiated by suitable buffer layers. In particular, indium-containing structures are suitable before the actual active zone as a buffer layer. Indium-containing nitridic semiconductors ($Ga_xAl_yIn_{1-(x+y)}N$ semiconductors) have a tendency toward segregation and formation of indium-containing phases. This leads to varying strain fields at the growth surface, promoting the formation of indium-rich islands in the active quantum well. GaInN layers approximately 100 nm thick can be deposited before the active zone in order to improve the GaInN quantum dot nucleation.

Previously, an optimum efficiency could be achieved with, for example, 2- to 10-fold quantum well structures. As can be shown experimentally, the emitted photons are generated exclusively in the two uppermost quantum wells (i.e. those closest to the p side). A suitable choice of growth parameters achieves the effect that the emission takes place exclusively in the uppermost of the quantum wells. The lower quantum wells serve for improving the nucleation of the GaInN islands in the uppermost quantum well. Dispensing with them causes the optical output power to be reduced by over 50%. However, these quantum wells lead to a considerable increase in the forward voltage. The forward voltage can be improved by reducing the number of wells at the expense of the quantum efficiency. The piezo fields, which lead to the observed increase in the forward voltage, can be compensated by high doping levels in the quantum well region. However, this adversely effects the crystal quality of the active layer or impairs the injection behavior and consequently reduces the internal quantum efficiency.

SUMMARY OF THE INVENTION

It is an advantage of the present invention to improve the optical semiconductor device set out above.

The present invention achieves this and other advantages through an optical semiconductor device with a multiple quantum well structure, comprising: at least one combination of alternating well layers and barrier layersboth further comprising various semiconductor layers, said well layers further comprising a first composition based on a nitride semiconductor material with a first electron energy, said barrier layers further comprising a second composition of a nitride semiconductor material with electron energy which is higher in comparison with the first electron energy, and a radiation-active quantum well layer, layered in direction of growth for which the well layers and barrier layers form a superlattice.

The invention provides a multiple quatum well structure with well layers and barrier layers comprising various types of semiconductor layers which are layered alternatively one on top of the other. The well layers are thin layers of a first composition based on a nitride semiconductor material with a first electron energy. The barrier layers are layers which are thicker in comparion to the well layers, are of a second composition of a nitride semiconductor material and are with electron energy which is higher in comparison with the first electron energy. Acting as the radiation-active quatum well, seen in the direction of growth, is firstly one of the last quatum well layers or the last quatum well layer. The well layers arranged in front, which essentially do not radiate, and the barrier layers form a superlattice for this last layer.

According to an embodiment of the invention, in the superlattice, the well layers are thin aluminum-gallium-indium-nitride layers, the barrier layers are gallium-nitride layers which are thicker in comparison, and the active quantum well has indium-gallium-nitride.

Within at least one well layer of the superlattice, the In content preferably increases in the direction of growth, i.e. in the direction of the radiation-active quantum well layer. At the same time, the indium content remote from the radiation-active quantum well layer is preferably below 5%.

In a particularly preferred development, at least one of the well layers of the superlattice has at least one pair of single layers, of which the first single layer, in the direction of growth, has a lower indium content than the second single layer. This well layer preferably has a plurality of single layers whose indium content increases step by step from the single layer lying furthest away from the radiation-active quantum well layer to the single layer lying closest to the radiation-active quantum well layer. It is particularly preferred for the steps of the increase in indium content to be smaller than 5%. It is also preferred for the indium content of the single layer furthest away from the radiation-active quatum well layer to be less than 5%. The thickness of the single layers preferably lies in the range of just a few monolayerst and particularly preferably approximately one monolayer.

The particular advantage of the step-by-step increase in the In content is that a potential profile resembling a delta potential is produced, in particular in the case where the thickness of the single layers does not significantly exceed that of a monolayer. The difference in the energy level in the barrier layers and the energy level obtained for one electron in the well layer is consequently not greater than in the case of a rectangular well layer with a significanly lower indium content as the uppermost single layer of the stepped well layer. Accordingly, the advantages of a reduced overall indium content are retained, but the strain is at the same time influenced by the high indium content of the last single layer in such a way that the nucleartion of InGaN-rich phases is improved and, consequently, the quantum efficiency is increased.

A further advantage arises for the following reason: the epitaxial growth of indium-containing III-V semiconductors (for example InGaAs, InGaN) is made more difficult by the relatively great atom radius of the indium. With constant fluxes of the group III components, indium is therefore incorporated with a delay. The indium concentration increases during the growth and approaches an equilibrium value exponentially. During the enriching phase, a certain indium coverage is formed on the growth surface. Only when this coverage is achieved is a constant amount of indium incorporated into the crystal. If, however, too much indium is offered, the indium present on the surface forms metallic droplets, which reduce the quality of the deposited layers. In particular, however, such indium droplets produce shunts at the p-n junction, reducing not only the quantum efficiency but also the stability with respect to electrostatic discharging (ESD). These effects are reduced by initially depositing indium-containing layers with a low indium content, preferably less than 5%, then increasing the indium content in subsequent layers. In the case of the active layer itself, the substructure is then already prepared by the well layers in such a way that InGaN compositions with a higher indium content can be deposited.

The nucleation of indium-rich phases is advantageously improved by the increasing indium content in the well layer or layers. The harmful formation of indium droplets is at least considerably reduced.

Further advantageous developments and refinements of the invention are the subject of subclaims.

DESCRIPTION OF THE SEVERAL VIEWS OF THE DRAWINGS

The invention is explained in more detail below on the basis of an exemplary embodiment with the aid of the figures, in which:

FIGS. 1a and 1b show a schematic representation of the layer structure of a device according to the invention FIG. 4 shows a schematic representation of the profile of the conduction band according to a particularly preferred embodiment of the invention.

DETAILED DESCRIPTION OF THE INVENTION

Figure 2:
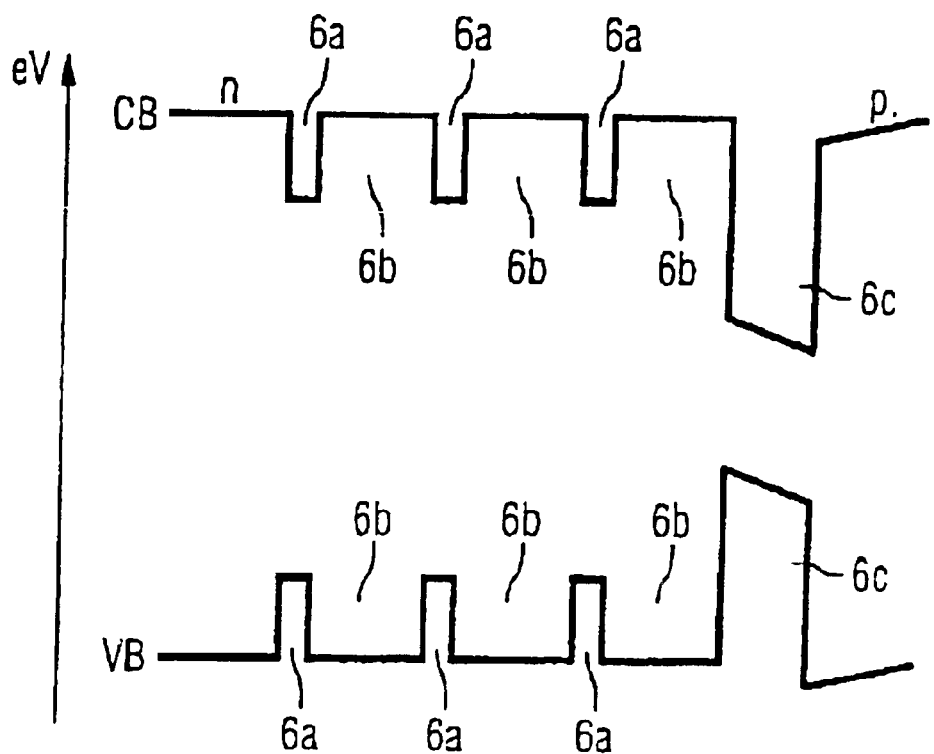
FIG. 2 shows a schematic representation of the quantum well structure of the device according to FIG. 1.

According to FIG. 1a, initially a buffer layer 3 of aluminum-gallium-nitride (AlGaN) is formed on a substrate 1 of silicon carbide (SiC), to which a first contact electrode 2 is connected. This is followed by a further layer 4 of aluminum-gallium-nitride. A further buffer layer 5 of silicon-doped gallium nitride is arranged over the layer 4. The quantum well structure 6a, 6b, still to be discussed in more detail, is arranged over buffer layer 5. Quantum well structure 6a and 6b are followed by the actual active layer 6c. Arranged over the active layer 6 is a further layer 7 of aluminum-gallium-nitride, which serves as an electron barrier. This layer 7 is preferably doped with magnesium. A further GaN layer, not designated, may be arranged between the layers 6 and 7. A gallium-nitride layer 8, on which a second contact electrode 9 of the device is provided, is arranged over the layer 7.

The right-hand side of the layer structure shows in a schematically indicated manner the band gap of the single layers between the valence band and the conduction band.

The buffer layer 3 functionally serves as a growth layer, which is required to allow the LED structure to grow on the silicon carbide substrate 1. The further aluminum-gallium-nitride layer 4, between the layers 3 and 5, has an aluminum content which changes in the direction of the gallium-nitride layer 5. The gallium-nitride layer 5 is preferably silicon doped. The layer 7 of magnesium-doped aluminum-gallium-nitride, arranged over the active layer 6, serves as an electron barrier.

This basic structure of FIG. 1a can be used as a standard for gallium-aluminum-indium nitride light-emittind diodes (LEDs).

FIG. 1b is an enlarged representation of the active layer 6 according to the invention. The layer with the quantum well structure 6 is constructed by layers 6a of gallium-indium-nitride (GaInN) being arranged between individual gallium-nitride (GaN) layers 6b. The actually active, i.e. light-emitting, layer 6c of gallium-indium-nitride (GaInN) is followed by the uppermost gallium-nitride layer 6b.

As can be seen, layers 6a and 6b of different thickness alternate. The thinner layers 6a of indium-gallium-nitride and the thicker layers 6b of gallium-nitride in this case form superlattices, in which the wells 6a are thin, i.e. thinner than 3 nm, and the layers 6b are 3 nm and above. The layers are produced by vapor-phase or molecular-beam epitaxy. In this case, a slow growth of 1–10 nm/min, preferably 1–2 nm/min, at low temperatures around 700° C. is intended.

The indium content lies below 24%, preferably however below 20%, and is therefore preferably reduced in comparison with customary indium contents. The layers 6a and 6b, depicted only once in the figure, may be arranged repeatedly one above the other. The layers may be structured repeatedly x=3 times. The uppermost gallium-nitride layer 6b is followed by the actually active, i.e. illuminating, layer 6c of indium-gallium-nitride.

It may preferably be envisaged to dope the quantum well structure 6a, 6b with silicon in a concentration of $10^{17}$ to $10^{18}$ cm$^3$. This once again provides a significant improvement in comparison with an undoped structure.

FIG. 2 shows the energy conditions for the valence band VB and the conduction band CB. The electron energy is plotted in the direction of the y-axis, the quantum wells with a width corresponding to the layer thickness are plotted in the direction of the x-axis. The uppermost gallium-nitride layer 6b is followed by the actually active layer 6c.

Figure 3:
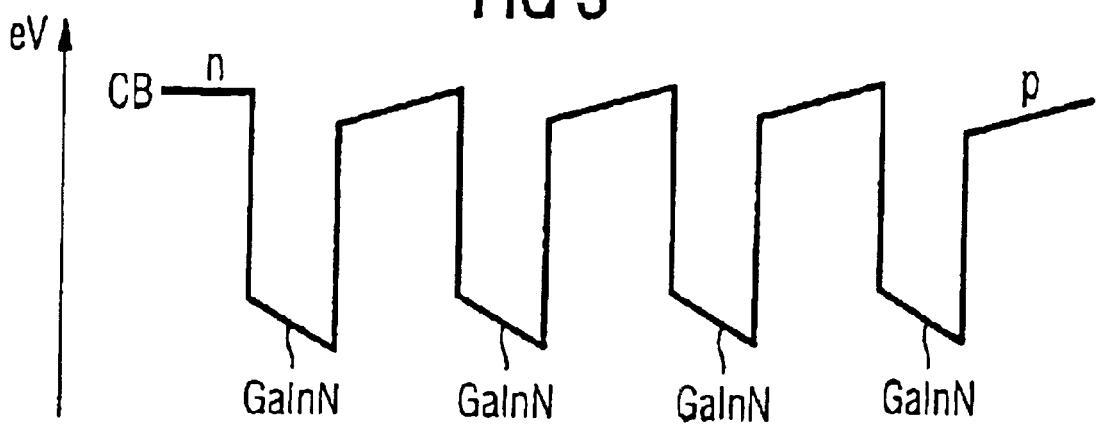
FIG. 3 shows a schematic representation of the quantum well structure of a customary type.

FIG. 3 shows by comparison the valence band with thicker quantum wells of gallium-indium-nitride than in the case of the invention. The effect of the piezoelectric fields produced by the strains is indicated by the sloping lines.

The use according to the invention of GaInN/GaN superlattices with thin wells (to a quantum well width of approximately 2 nm) in a layer structure according to FIG. 1 and with quantum well conditions according to FIG. 2 allows the forward voltage to be significantly lowered and, at the same time, the high internal quatum efficiency of the indium-gallium-nitride based optical semiconductor device to be maintained. The piezo fields, otherwise formed, are avoided entirely or have virtually no effect any longer. In comparison with customary single quantum-well structures, in which no gallium-indium-nitride superlattice is deposited before the active well, the device structure according to the invention has twice the conversion efficiency.

Superlattices are understood as meaning generally a particularly periodic sequence of layers only a few atomic layers thick. The superlattice is separated from the active well by a GaN or AlGaN barrier (>3 nm). The silicon doping of the quantum well structure is significantly improved in comparison with the undoped structure.

In comparison with known superlattice structures, the device structure according to the invention has a forward voltage that is lowered by >0.5 V.

In comparison with SQW (Single Quantum Well) structures, in which no GaInN superlattice is deposited before its active quantum well, it has been possible to double the conversion efficiency.

The combination of thin, and low-indium-content, optically inactive quantum wells ("pre-wells") with an active quantum well 6c allows the emission behavior of the previously known multiple quantum well structures to be maintained and the forward voltage to be lowered. The thin GaInN quantum wells improve the quality of the active quantum well, while the low layer thickness of the "pre-wells" and their low indium content have the effect of reducing the formation of disturbing piezo fields. The forward voltage is therefore not increased by this nucleation layer in comparison with a SQW structure.

FIG. 4 shows the profile of the conduction band in an InGaN well layer 6a between two GaN barrier layers, the GaN barrier layer 6a comprising a total of 4 single layers 60a to 63a. The indium content increases step by step from the single layer 60a lying furthest away from the radiation-active quantum well layer 6c to the single layer 63a lying closest to the radiation-active quantum well layer 6c. The steps of the increase in the indium content are smaller than 5% and the indium content of the single layer 60a lying furthest away from the radiation-active quantum well layer 6c is less than 5%. The layer thickness of each of the single layers 60a to 63a lies in the range of just a few monolayers or corresponds approximately to one monolayer of the composition.

This produces a potential profile which is similar to a delta potential. Consequently, the difference between the energy level in the barrier layers and the energy level obtained for an electron in the stepped well layer is no greater than in the case of a rectangular well layer (represented on the right-hand side in the figure) with a much lower indium content than the uppermost single layer of the stepped well layer. This achieves the effect that the advantages of a reduced overall indium content are maintained, but at the same time the strain is influenced by the high indium content of the last single layer in such a way that the nucleation of InGaN-rich phases is improved, and consequently the quantum efficiency is increased.

The description of the invention on the basis of the above exemplary embodiment is of course not to be understood as a restriction of the invention to this embodiment. Rather, the invention also relates to devices in other material systems in which similar problems are to be solved.

What is claimed is:

1. An optical semiconductor device with a multiple quantum well structure, comprising:
   at least one combination of alternating well layers and barrier layers, both comprising various semiconductor layers, said well layers comprising a first composition based on a nitride semiconductor material with a first electron energy, said barrier layers comprising a second composition of a nitride semiconductor material with electron energy which is higher in comparison with the first electron energy, and a radiation-active quantum well layer for which the well layers and barrier layers form a superlattice, the well layers of the first composition are essentially non-radiating well layers below the radiation-active quantum well layer.

2. The optical semiconductor device according to claim 1, wherein the well layers comprise thin aluminum-indium-gallium-nitride layers and the barrier layers comprise gallium-nitride or aluminum-gallium-nitride layers which are thicker than the well layers and the radiation-active quantum well comprises an indium-gallium-nitride layer.

3. The optical semiconductor device according to claim 2, wherein the well layers and barrier layers are doped with silicon.

4. The optical semiconductor device according to claim 3, wherein the dopant concentration is from $10^{17}$ to $10^{18}$ cm$^3$.

5. The optical semiconductor device according to claim 2, wherein the radiation-active quantum well follows an uppermost barrier layer.

6. The optical semiconductor device according to claim 2, wherein layer thickness of the radiation-active quantum well is greater than layer thickness of the well layers of the superlattice.

7. The optical semiconductor device according to claim 2, wherein the well layers are thinner than 2 nm and the barrier layers are at least 3 nm thick.

8. The optical semiconductor device according to claim 1, wherein the radiation-active quantum well follows an uppermost barrier layer.

9. The optical semiconductor device according to claim 8, wherein the well layers and barrier layers are doped with silicon.

10. The optical semiconductor device according to claim 1, wherein layer thickness of the radiation-active quantum well is greater than layer thickness of the well layers of the superlattice.

11. The optical semiconductor device according to claim 1, wherein the well layers are thinner than 2 nm and the barrier layers are at least 3 nm thick.

12. An optical semiconductor device with a multiple quantum well structure, comprising:
    at least one combination of alternating well layers and barrier layers, both comprising various semiconductor layers, said well layers comprising a first composition based on a nitride semiconductor material with a first electron energy, said barrier layers comprising a second composition of a nitride semiconductor material with electron energy which is higher in comparison with the first electron energy, and a radiation-active quantum well layer for which the well layers and barrier layers form a superlattice wherein within at least one well layer of the superlattice, the In content increases in a direction of growth.

13. The optical semiconductor device according to claim 12, wherein in the well layer the indium content, remote from the quantum well layer, lies below 5%.

14. An optical semiconductor device with a multiple quantum well structure, comprising:
    at least one combination of alternating well layers and barrier layers, both comprising various semiconductor layers, said well layers comprising a first composition based on a nitride semiconductor material with a first electron energy, said barrier layers comprising a second composition of a nitride semiconductor material with electron energy which is higher in comparison with the first electron energy, and a radiation-active quantum well layer for which the well layers and barrier layers form a superlattice, wherein at least one of the well layers of the superlattice has at least one pair of single layers of which a first of the at least one pair, in a direction of growth, has a lower indium content than a second of the at least one pair in a direction of growth.

15. The optical semiconductor device according to claim 14, wherein the second of the at least one pair has an increased indium content of less than 5% of the first of the at least one pair.

16. The optical semiconductor device according to claim 15 wherein the well layer comprises a plurality of single layers whose indium content increases from a first of the plurality of single layers lying furthest away from the quantum well layer to a single layer lying closest to the radiation-active quantum well layer.

17. The optical semiconductor device according to claim 15, wherein the indium content of the first of the pair of single layers is less than 5%.

18. The optical semiconductor device according to claim 15, wherein a thickness of each of the plurality of single layers comprises at least one monolayer.

19. The optical semiconductor device according to claim 14 wherein the well layer comprises a plurality of single layers whose indium content increases from a first of the plurality of single layers lying furthest away from the quantum well layer to a single layer lying closest to the radiation-active quantum well layer.

20. The optical semiconductor device according to claim 19, wherein the indium content increase is smaller than 5%.

21. The optical semiconductor device according to claim 14, wherein the indium content of the first of the at least one pair of single layers is less than 5%.

22. The optical semiconductor device according to claim 14, wherein a thickness of each of the plurality of single layers comprises at least one monolayer.

23. The optical semiconductor device according to claim 14, wherein a thickness of each of the plurality of single layers is approximately one monolayer.

24. An optical semiconductor device with a multiple quantum well structure, comprising: at least one combination of alternative well layers and barrier layers, both comprising various semiconductor layers, said well layers comprising a first composition based on a nitride semiconductor material with a first electron energy, said barrier layers comprising a second composition of a nitride semiconductor material with electron energy which is higher in comparison with the first electron energy, and a radiation-active quantum well layer for which the well layers and barrier layers form a superlattice, wherein the well layers comprise thin aluminum-indium-gallium-nitride layers and the barrier layers comprise gallium-nitride or aluminium-gallium-nitride layers which are thicker than the well layers and the radiation-active quantum well comprises an indium-gallium-nitride layer, wherein within a, least one well layer of the superlattice, the In content increases in a direction of growth.

25. An optical semiconductor device with a multiple quantum well structure, comprising:

at least one combination of alternating well layers and barrier layers, both comprising various semiconductor layers, said well layers comprising a first composition based on a nitride semiconductor material with a first electron energy, said barrier layers comprising a second composition of a nitride semiconductor material with electron energy which is higher in comparison with the first electron energy, and a radiation-active quantum well layer for which the well layers and barrier layers form a superlattice, wherein the well layers comprise thin aluminum-indium-gallium-nitride layers and the barrier layers comprise gallium-nitride or aluminum-gallium-nitride layers which are thicker than the well layers and the radiation-active quantum well comprises an indium-gallium-nitride layer, wherein at least one of the well layers of the super-lattice has at least one pair of single layers of which a first of the pair, in a direction of growth, has a lower indium content than a second of the pair in a direction of growth.

* * * * *

UNITED STATES PATENT AND TRADEMARK OFFICE
CERTIFICATE OF CORRECTION

PATENT NO. : 6,849,881 B1
DATED : February 1, 2005
INVENTOR(S) : Volker Härle et al.

It is certified that error appears in the above-identified patent and that said Letters Patent is hereby corrected as shown below:

Title page,
Item [57], ABSTRACT,
Line 2, after "structure" delete ","

Column 6,
Line 42, after "superlattice" insert -- , --

Column 8,
Line 10, replace "a," with -- at --

Signed and Sealed this

Fifth Day of July, 2005

JON W. DUDAS
*Director of the United States Patent and Trademark Office*

UNITED STATES PATENT AND TRADEMARK OFFICE
CERTIFICATE OF CORRECTION

PATENT NO.        : 6,849,881 B1
APPLICATION NO.   : 09/913394
DATED             : February 1, 2005
INVENTOR(S)       : Volker Härle et al.

It is certified that error appears in the above-identified patent and that said Letters Patent is hereby corrected as shown below:

Title page, item

(75) INVENTORS:
      delete "Andreas Weimer, Regensburg (DE)",
      insert -- Andreas Weimar, Regensburg (DE) --

Signed and Sealed this

Sixth Day of March, 2007

JON W. DUDAS
*Director of the United States Patent and Trademark Office*